United States Patent [19]
Shim et al.

[11] Patent Number: 5,953,589
[45] Date of Patent: Sep. 14, 1999

[54] BALL GRID ARRAY SEMICONDUCTOR PACKAGE WITH SOLDER BALLS FUSED ON PRINTED CIRCUIT BOARD AND METHOD FOR FABRICATING THE SAME

[75] Inventors: Il Kwon Shim; Young Wook Heo, both of Seoul, Rep. of Korea; Robert Francis Darreaux, Chandler, Ariz.

[73] Assignees: Anam Semiconductor Inc., Seoul, Rep. of Korea; Amkor Technology, Inc., Chandler, Ariz.

[21] Appl. No.: 08/915,077

[22] Filed: Aug. 20, 1997

[30] Foreign Application Priority Data

Dec. 30, 1996 [KR] Rep. of Korea ................. 96-77898
Dec. 30, 1996 [KR] Rep. of Korea ................. 96-77899
Feb. 14, 1997 [KR] Rep. of Korea ................. 97-4430

[51] Int. Cl.$^6$ ............ H01L 21/44; H01L 21/48; H01L 21/50
[52] U.S. Cl. .................... 438/106; 438/107; 438/108
[58] Field of Search .................... 438/106, 107, 438/108

[56] References Cited

U.S. PATENT DOCUMENTS 5,216,278  6/1993  Lin et al. .
5,620,928  4/1997  Lee et al. ................. 438/118
5,793,118  8/1998  Nakajima ................. 257/790

*Primary Examiner*—Kevin M. Picardat
*Assistant Examiner*—Deven Collins
*Attorney, Agent, or Firm*—Skjerven, Morrill, MacPherson, Franklin & Friel LLP; Don C. Lawrence

[57] ABSTRACT

A ball grid array semiconductor package using a flexible circuit board, in which the flexible circuit board has no conductive via hole nor solder mask while having a thin structure formed at only one surface thereof with a circuit pattern having a small length. The flexible circuit board is mounted with a metallic carrier frame to achieve an easy handling thereof, a reduction in the inductance, impedance and coupling effect of adjacent circuit patterns and an easy discharge of heat from a semiconductor chip, thereby achieving an improvement in electrical performance and an improvement in heat discharge performance. The metallic carrier frame has a plurality of openings adapted to increase the bonding force between an encapsulate and constituting elements of the package, thereby removing a bending phenomenon of the package, and a method for fabricating such a BGA semiconductor package. The invention also provides a method for fabricating such a BGA semiconductor package.

20 Claims, 12 Drawing Sheets

BALL GRID ARRAY SEMICONDUCTOR PACKAGE WITH SOLDER BALLS FUSED ON PRINTED CIRCUIT BOARD AND METHOD FOR FABRICATING THE SAME

BACKGROUND OF THE INVENTION

1. Field of the Invention

The present invention relates to a ball grid array (BGA) semiconductor package using a flexible circuit board and a method for fabricating the same. More particularly, the present invention relates to a BGA semiconductor package using a flexible circuit board, in which the flexible circuit board is mounted with a metallic carrier frame to obtain a thin package structure and to increase the bonding force between an encapsulate and constituting elements of the package, thereby achieving an improvement in the electrical performance and heat discharge performance of circuit patterns, removing a bending phenomenon of the package, and achieving an improvement in the reliability of the package. The present invention also relates to a method for fabricating such a BGA semiconductor package.

2. Description of the Prior Art

Generally, semiconductor packages are adapted to encapsulate a semiconductor chip, which consists of various electronic circuits and wirings bonded thereto in the form of a single device or integrated circuit, using an encapsulant, thereby protecting the semiconductor chip from external environments such as dust, moisture, and electrical and mechanical load. In order to optimize and maximize the performance of the semiconductor chip, such semiconductor packages have a lead frame or printed circuit board (PCB) which provides signal input/output terminals coupled to a main board.

Such semiconductor packages include resin encapsulated packages, tape carrier packages (TCP's), glass encapsulated packages, and metal encapsulated packages. These semiconductor packages are classified into those of the through-hole type and those of the surface mount type. The through-hole type semiconductor packages include dual in-line packages (DIP's) and pin grid array (PGA) packages whereas the surface mount type packages include quad flat packages (QFP's), ball grid array (BGA) packages, and bottom leaded packages (BLP's).

The recent tendency of electronic devices to obtain a compact structure results in a requirement for providing semiconductor packages capable of achieving an increase in the mount density of a main board used. In this regard, BGA semiconductor packages have been mainly used, as compared to DIP's. In particular, BGA semiconductor packages using solder balls as input/output terminals have been mainly used. An example of such BGA semiconductor packages is illustrated in FIG. 1.

As shown in FIG. 1, the BGA semiconductor package, which is denoted by the reference numeral 10', includes a PCB 20'. This PCB 20' has a substrate 25' made of a glass fiber reinforced thermosetting composite. A pair of complex and fine circuit patterns 21' are formed on the upper and lower surfaces of the substrate 25', respectively. The circuit patterns 21' are comprised of conductive plated films formed on the upper and lower surfaces of the substrate 25'. A pair of thin film solder masks 23' made of polymer resin are formed over the circuit patterns 21', respectively. A semiconductor chip 11' is centrally bonded to the upper surface of the PCB 20'. The semiconductor chip 11' has input/output pads 12' bonded to the circuit patterns 21' by means of conductive wires 13'. The upper and lower circuit patterns 21' are connected to each other by means of conductive via holes 24'. A plurality of solder ball lands 22' are formed on the lower circuit pattern 21'. A plurality of solder balls 30', which serve as input/output terminals with respect to a main board, are fused on the solder ball lands 22', respectively. The BGA semiconductor package 20' also includes an encapsulant 14' which is formed to have a one side molded structure using a glob top or epoxy molding compound, thereby protecting the semiconductor chip 11', conductive wires 13' and circuit patterns 21' from the environment.

In the BGA semiconductor package having the above-mentioned configuration, the semiconductor chip 11' has a signal conduction relation with the main board (not shown) via the conductive wires 13', upper circuit pattern 21' of PCB 20', conductive via holes 24', lower circuit pattern 21' of PCB 20', solder ball lands 22' and solder balls 30'. Thus, an electrical function of the semiconductor chip 11' is achieved.

The BGA semiconductor package can easily accommodate a semiconductor chip having a plurality of input/output pads because it has, at the lower surface thereof, a plurality of solder balls serving as input/output terminals. The BGA semiconductor package also has a compact and thin structure. Accordingly, such a BGA semiconductor package has been widely used in various advanced technical fields using semiconductor chips.

However, such a conventional BGA semiconductor package has a problem in that it is difficult to easily discharge heat generated during the operation of the semiconductor chip because the BGA semiconductor package uses a PCB having a large thickness of at least several hundred microns, thereby exhibiting a high thermal resistivity. Furthermore, there is no appropriate heat discharge means in the BGA semiconductor package. As a result, it is difficult to appropriately discharge heat from the semiconductor chip, thereby causing the semiconductor chip and package to crack. A degradation in the electrical performance of the semiconductor chip also occurs.

The thickness of the PCB also results in a difficulty to provide a thin and light package structure. Moreover, the conventional BGA semiconductor package uses elongated signal lines extending from the semiconductor chip to the main board because the input/output pads of the semiconductor chip are electrically connected to an elongated and fine circuit pattern formed on the upper surface of the thermosetting composite substrate of the PCB by conductive wires while the circuit pattern is electrically connected to the main board through conductive via holes, circuit pattern formed on the lower surface of the substrate, solder ball lands and solder balls. The increased length of the signal lines results in an increase in the inductance and impedance in the signal lines. Furthermore, a coupling effect occurs between adjacent circuit patterns, thereby greatly degrading the electrical performance of the semiconductor chip.

Meanwhile, the PCB is easily bent under the condition in which high temperature heat is generated because it has flexibility. When the PCB is bent, the solder balls arranged on the lower surface of the PCB may separate from the main board, thereby causing the semiconductor chip to fail its electrical performance.

Although the electrical performance of semiconductor chips is advanced by virtue of the developments of semiconductor chip design techniques, it is adversely affected by the above-mentioned degraded package structure. Consequently, the conventional package structure is problematic in that it serves as a factor of degrading the electrical performance of semiconductor chips.

SUMMARY OF THE INVENTION

Therefore, an object of the invention is to solve the above-mentioned problems involved in the prior art and to provide a BGA semiconductor package using a flexible circuit board, in which the flexible circuit board has no conductive via hole nor solder mask while having a thin structure of 20 to 150 microns formed at only one surface thereof with a circuit pattern having a small length, and a method for fabricating such a BGA semiconductor package.

Another object of the invention is to provide a BGA semiconductor package using a flexible circuit board, in which the flexible circuit board is mounted with a metallic carrier frame to achieve an easy handling thereof, a reduction in the inductance, impedance and coupling effect of adjacent circuit patterns and an easy discharge of heat from a semiconductor chip, thereby achieving an improvement in electrical performance and an improvement in heat discharge performance, and a method for fabricating such a BGA semiconductor package.

Another object of the invention is to provide a BGA semiconductor package using a flexible circuit board, in which the flexible circuit board is mounted with a metallic carrier frame having a plurality of openings adapted to increase the bonding force between an encapsulate and constituting elements of the package, thereby removing a bending phenomenon of the package, and a method for fabricating such a BGA semiconductor package.

In accordance with one aspect, the present invention provides a ball grid array semiconductor package comprising: a semiconductor chip having a plurality of input/output pads at an upper surface thereof; a flexible circuit board bonded to a lower surface of the semiconductor chip by adhesive means, the flexible circuit board including a flexible resin film and a circuit pattern formed on the flexible resin film; conductive wires adapted to connect the circuit pattern of the flexible circuit board to the input/output pads of the semiconductor chip; encapsulate means adapted to encapsulate the semiconductor chip and the conductive wires, thereby protecting them from the environment; and a plurality of solder balls fused as input/output terminals on a lower surface of the flexible circuit board.

In accordance with another aspect, the present invention provides a method for fabricating a ball grid array semiconductor package comprising the steps of: forming a plurality of circuit patterns on a strip-shaped flexible resin film, thereby forming a strip-shaped flexible circuit board; bonding a strip-shaped carrier frame, which comprises a plurality of outer support plates, to the flexible circuit board using adhesive means in such a manner that the carrier frame is aligned with the flexible circuit board; bonding semiconductor chips to the flexible circuit board using adhesive means; wire-bonding the semiconductor chips to the circuit patterns of the flexible circuit board by conductive wires, respectively; encapsulating the semiconductor chips and the conductive wires by encapsulate means to protect them from the environment; fusing a plurality of solder balls as input/output means on the lower surface of the flexible circuit board, thereby forming a strip-shaped package structure having a plurality of packages; and cutting the strip-shaped package structure to separate the packages into the form of individual units.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1:
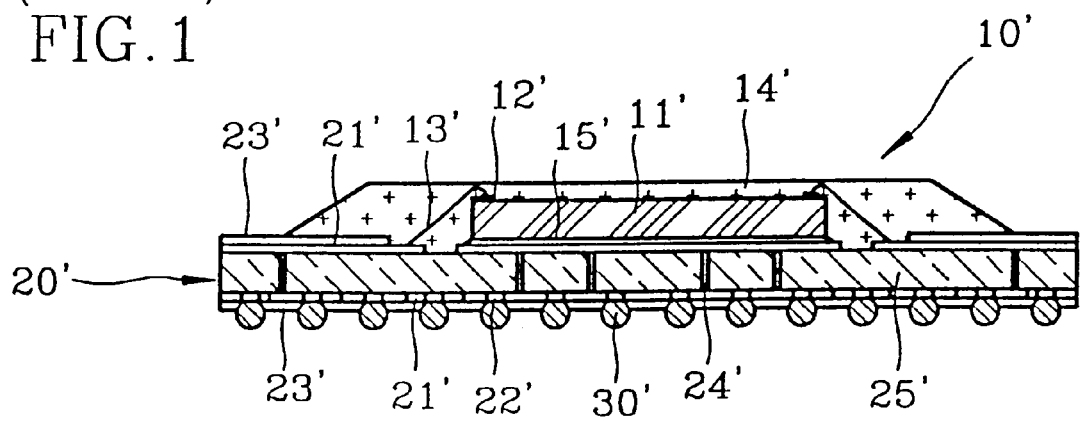
FIG. 1 is a sectional view illustrating a conventional BGA semiconductor package.
Figure 2A:
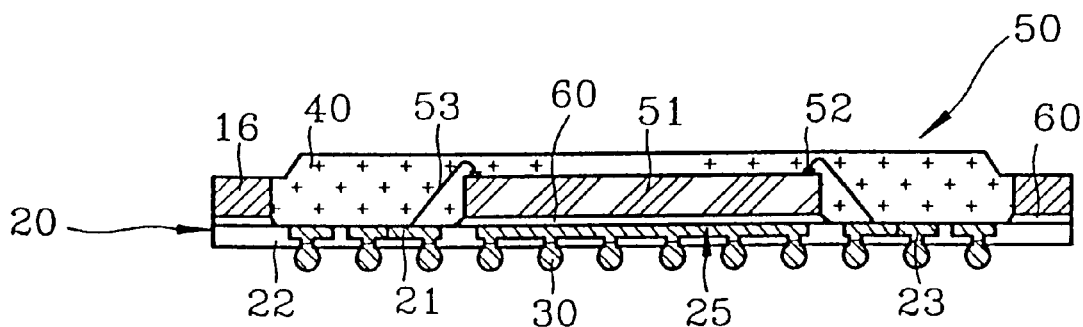
FIGS. 2A to 2C are sectional views respectively illustrating BGA semiconductor packages fabricated using flexible circuit boards configured in accordance with the first, second and third embodiments of the present invention.
Figure 2B:
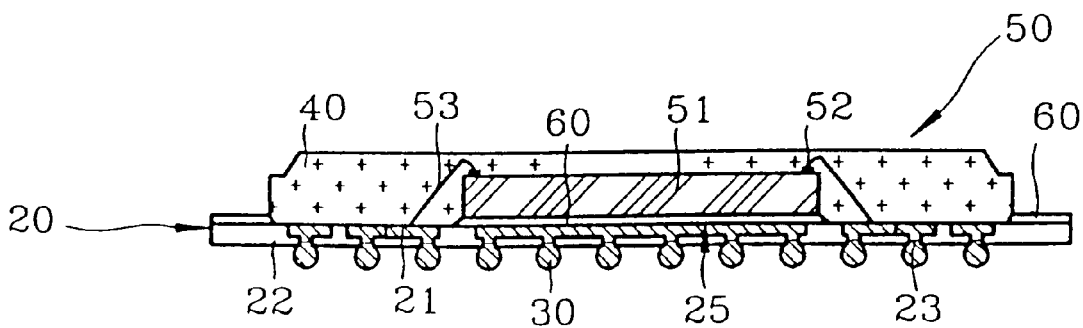
Figure 2C:
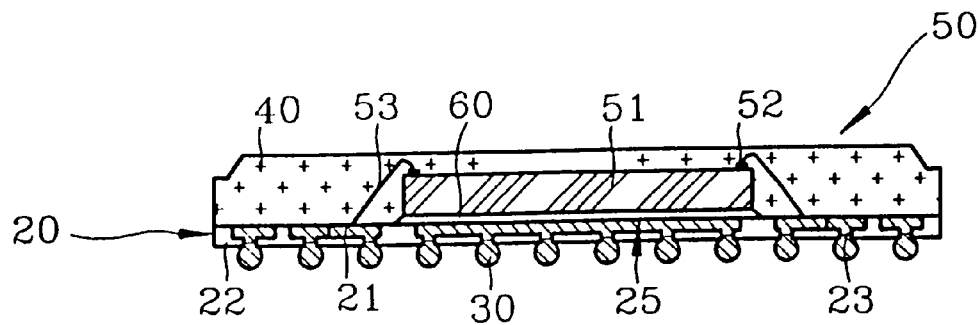

FIGS. 2A to 2C illustrate BGA semiconductor packages respectively fabricated using flexible circuit boards configured to provide, in particular, a thin package structure in accordance with different embodiments of the present invention. In FIGS. 2A to 2C, the same reference numerals denote the same elements, respectively. In FIGS. 2A to 2C, each BGA semiconductor package is denoted by the reference numeral 50. FIG. 2A illustrates a first embodiment of the present invention in which an outer support plate 16, which is included in a carrier frame provided for the support and easy handling of constituting elements of a package, is bonded to the outer edge portion of the upper surface of a flexible circuit board 20 by an adhesive means 60 while being in contact with the outer edge of an encapsulate 40. FIG. 2B illustrates a second embodiment of the present invention similar to the first embodiment in that the outer support plate 16 is used. In accordance with the second embodiment, however, the outer support plate 16 is removed in the process of the package fabrication. That is, a package structure is obtained in which an encapsulate 40 is formed on a region inwardly spaced from the outer edge of the flexible circuit board 20 by a desired distance. FIG. 2C illustrates a third embodiment of the present invention in which the outer edge of the encapsulate 40 is aligned with the outer edge of the flexible circuit board 20 as the outer support plate 16 and the portion of the flexible circuit substrate 20, to which the outer support plate 16 is bonded, are removed in the process of the package fabrication.

Figure 3A:
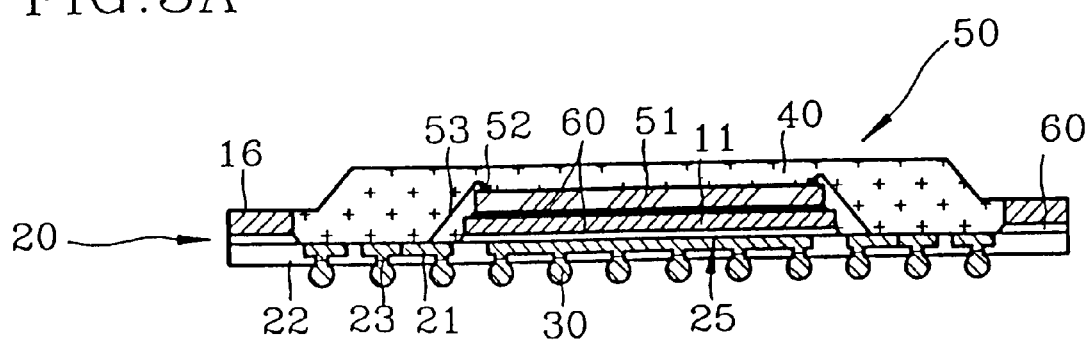
FIGS. 3A to 3C are sectional views respectively illustrating BGA semiconductor packages fabricated using flexible circuit boards configured in accordance with the fourth, fifth and sixth embodiments of the present invention.
Figure 3B:
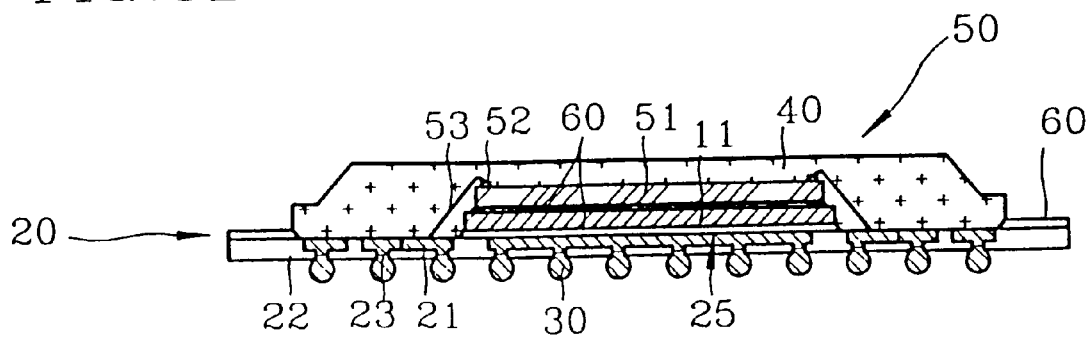
Figure 3C:
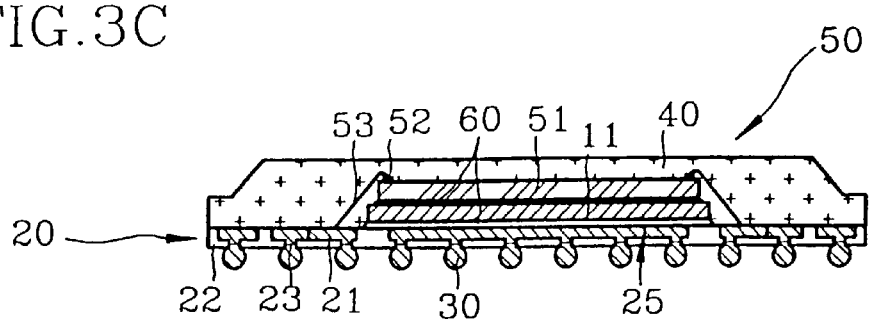

On the other hand, FIGS. 3A to 3C illustrate BGA semiconductor packages respectively fabricated using flexible circuit boards configured to obtain, in particular, an improvement in the electrical performance and heat discharge performance of packages in accordance with embodiments of the present invention which are different from those of FIGS. 2A to 2C. In FIGS. 3A to 3C, elements respectively corresponding to those in FIGS. 2A to 2C are denoted by the same reference numerals. FIG. 3A illustrates a fourth embodiment of the present invention in which an outer support plate 16, which is included in a carrier frame provided for the support and easy handling of constituting elements of a package, is bonded to the outer edge portion of the upper surface of a flexible circuit board 20 by means of an adhesive means 60 while being in contact with the outer edge of an encapsulate 40. In accordance with the fourth embodiment, a heat discharge plate 11, which is included in the carrier frame, is bonded at its lower surface to a die paddle 25 of the flexible circuit board 20 by the adhesive means 60 in order to easily discharge heat from a semiconductor chip 51. FIG. 3B illustrates a fifth embodiment of the present invention different from the fourth embodiment in that an encapsulate 40 is formed on a region inwardly spaced from the outer edge of the flexible circuit board 20 by a desired distance as the outer support plate 16 is removed in the process of the package fabrication. FIG. 3C illustrates a sixth embodiment of the present invention in which the outer edge of the encapsulate 40 is aligned with the outer edge of the flexible circuit board 20 as the outer support plate 16 and the portion of the flexible circuit substrate 20, to which the outer support plate 16 is bonded, are removed in the process of the package fabrication.

Figure 3D:
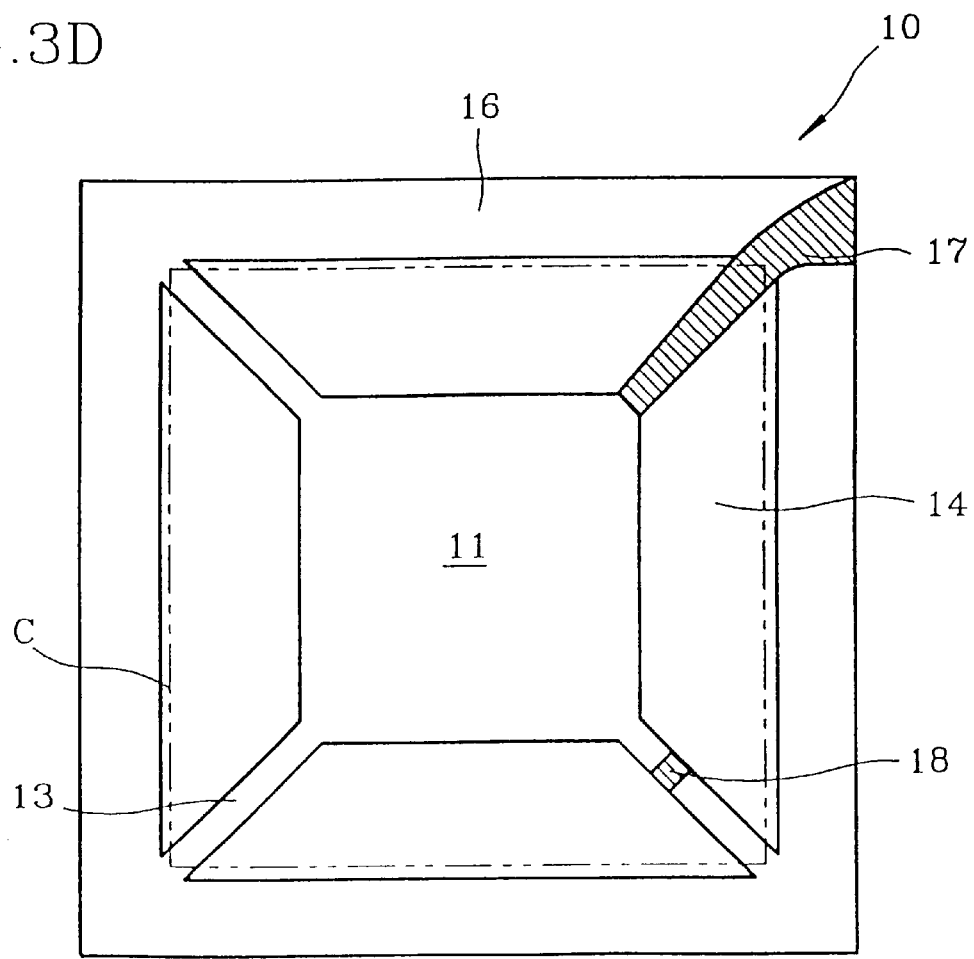
FIG. 3D is a plan view illustrating a carrier frame used in the fourth, fifth and sixth embodiments of the present invention.

In addition, FIG. 3D is a plan view illustrating the carrier frame 10 which is used in the fourth, fifth and sixth embodiments of the present invention to improve the electrical performance and heat discharge performance of packages. As shown in FIG. 3D, the heat discharge plate 11 is formed at the central portion of the carrier frame 10. Tie bars 13 are formed at four corners of the heat discharge plate 11. The outer support plate 16, which has a square rim shape, is arranged around the heat discharge plate 11 in such a manner that it is connected with the outer ends of the tie bars 13. A plurality of openings 14 are formed between the heat discharge plate 11 and outer support plate 16.

Figure 4A:
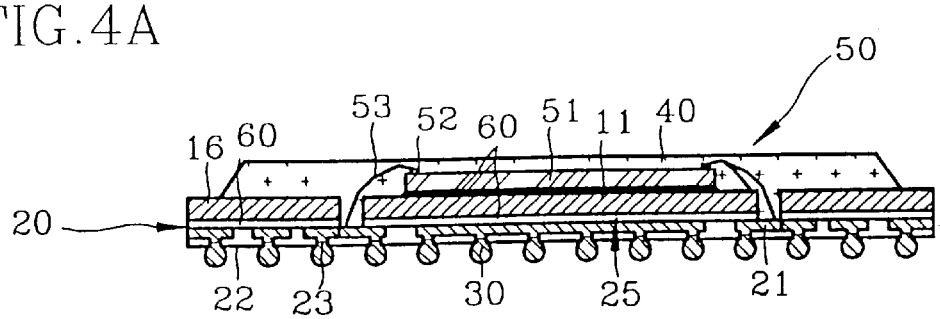
FIG. 4A is a sectional view illustrating a BGA semiconductor packages using a flexible circuit board configured in accordance with the seventh embodiment of the present invention.
Figure 4B:
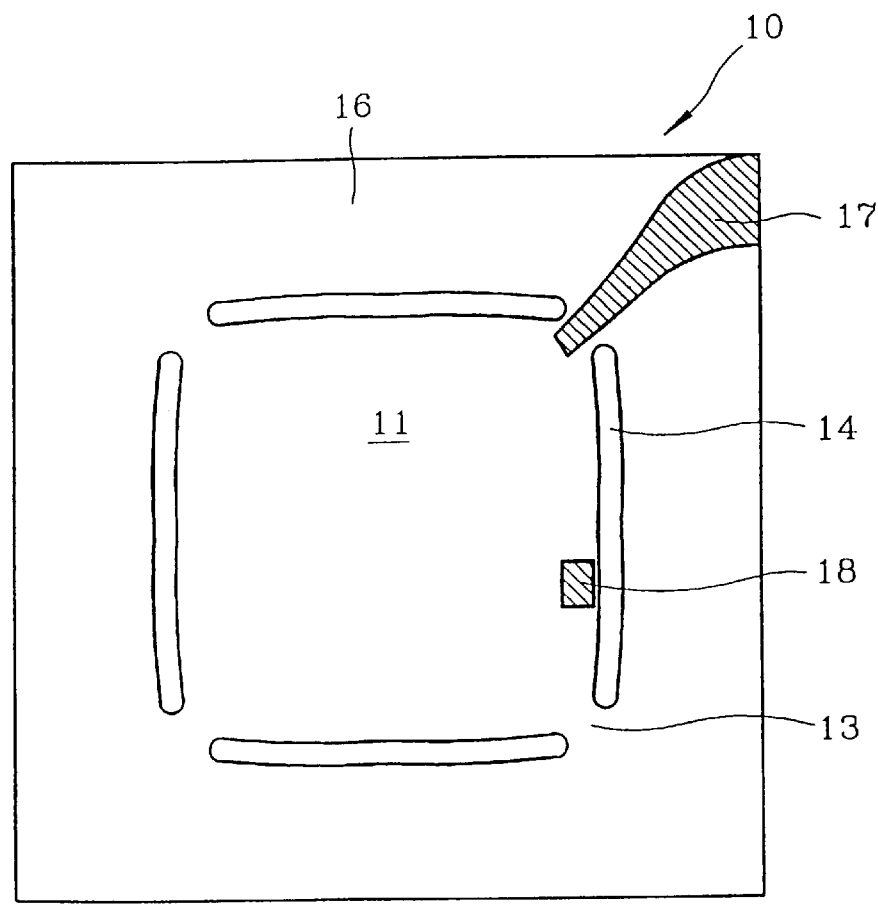
FIG. 4B is a plan view illustrating a carrier frame used in the seventh embodiment of the present invention.

FIGS. 4A and 4B illustrate a BGA semiconductor package using a carrier frame 10 configured in accordance with a seventh embodiment of the present invention, respectively. As shown in FIGS. 4A and 4B, the carrier frame 10 of this embodiment has openings 14 which have a slot shape. These openings 14 are formed only in a region where the circuit pattern 21 on the flexible circuit board is wire-bonded to input/output pads 52 of the semiconductor chip 51. This configuration is adapted to further improve the electrical performance and heat discharge performance of the package.

Figure 5A:
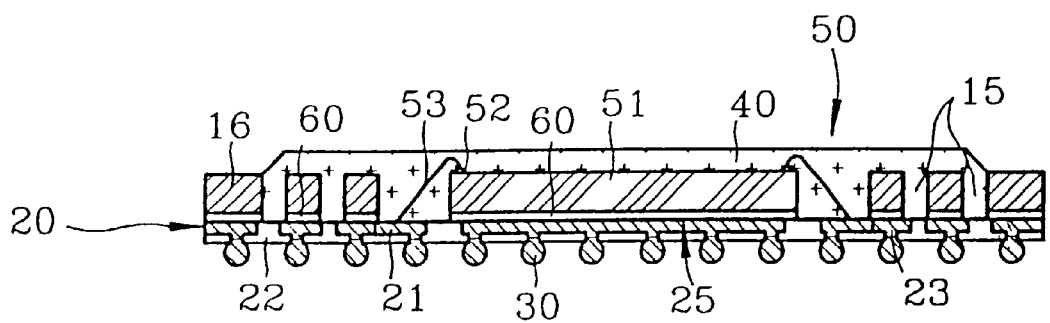
FIGS. 5A and 5B are sectional views respectively illustrating BGA semiconductor packages fabricated using flexible circuit boards configured in accordance with the eighth and ninth embodiments of the present invention.
Figure 5B:
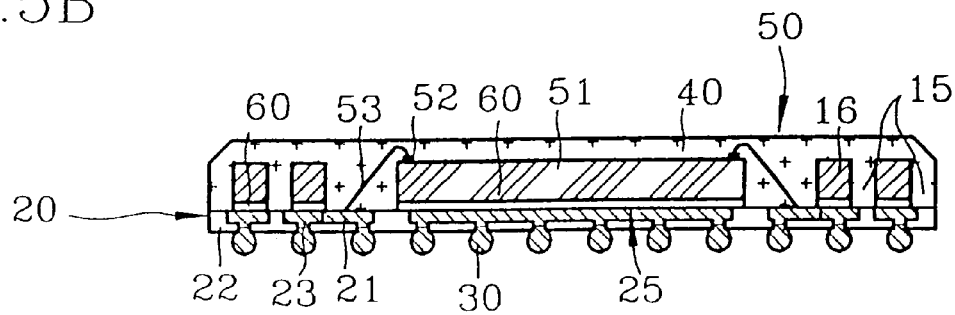
Figure 5C:
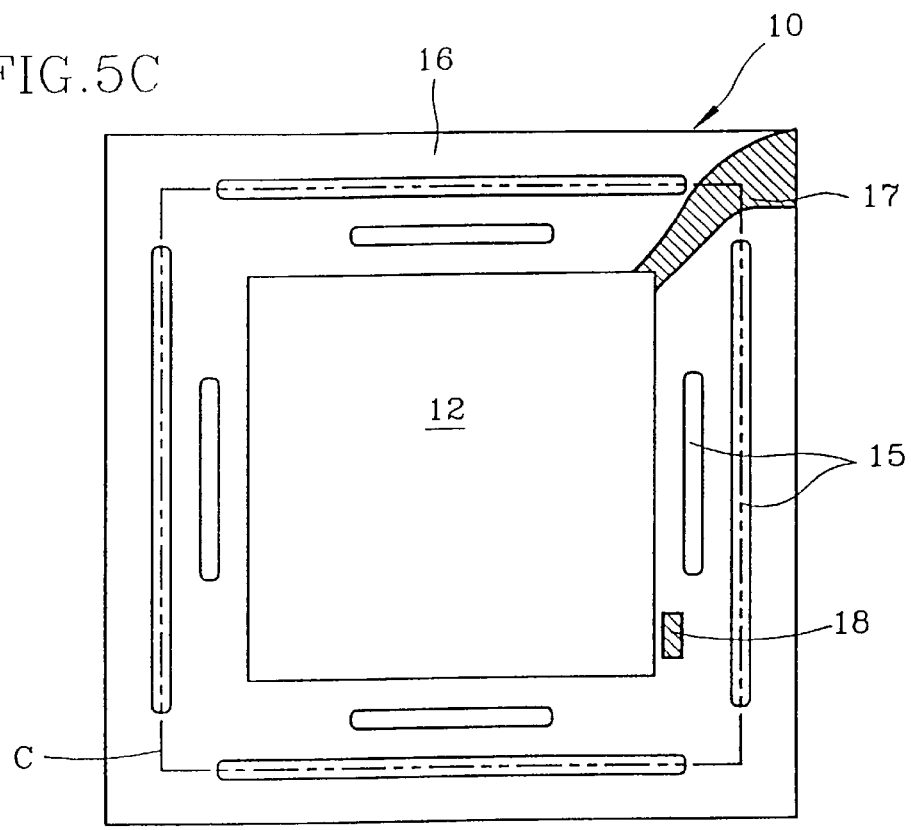
FIG. 5C and 5D are plan views respectively illustrating carrier frames used in the eighth and ninth embodiments of the present invention.
Figure 5D:
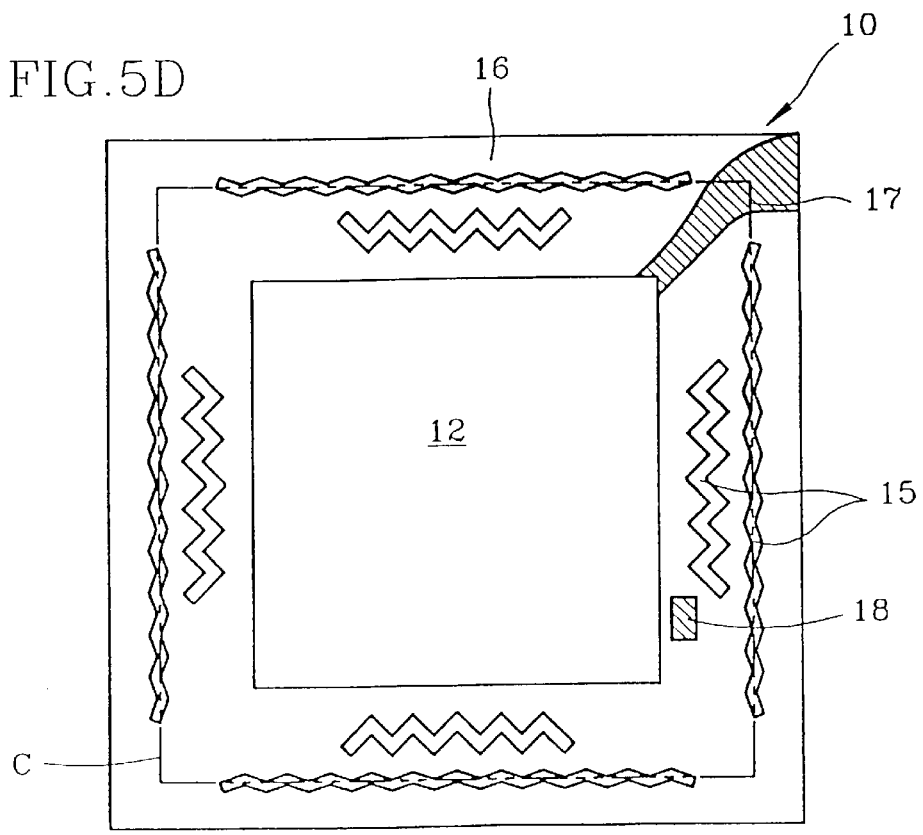

FIGS. 5A to 5D are sectional views and plan views respectively illustrating BGA semiconductor packages respectively using carrier frames 10 configured to improve the bonding force between the encapsulate 40 and other constituting elements of the BGA semiconductor packages in accordance with eighth and ninth embodiments of the present invention. As shown in FIGS. 5C and 5D, a plurality of slots 15 are formed in the carrier frame 10 in accordance with the eighth or ninth embodiment. By virtue of such a configuration, the bonding area between the encapsulate 40 and outer support plate 16 increases as shown in FIG. 5A or 5B. In particular, in the case of the ninth embodiment, the slots have a wave shape.

Figure 6A:
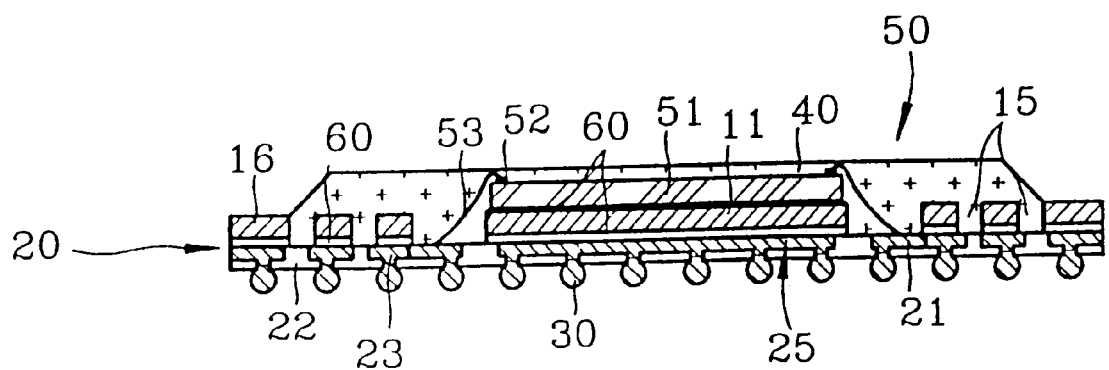
FIGS. 6A and 6B are sectional views respectively illustrating BGA semiconductor packages fabricated using flexible circuit boards configured in accordance with the tenth and eleventh embodiments of the present invention.
Figure 6B:
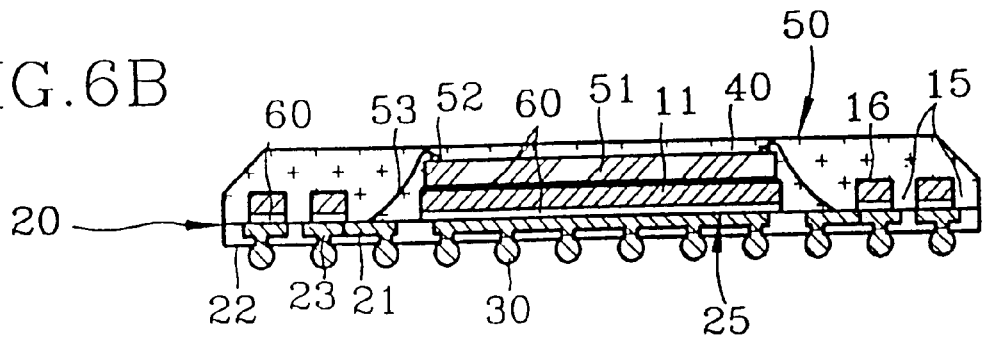
Figure 6C:
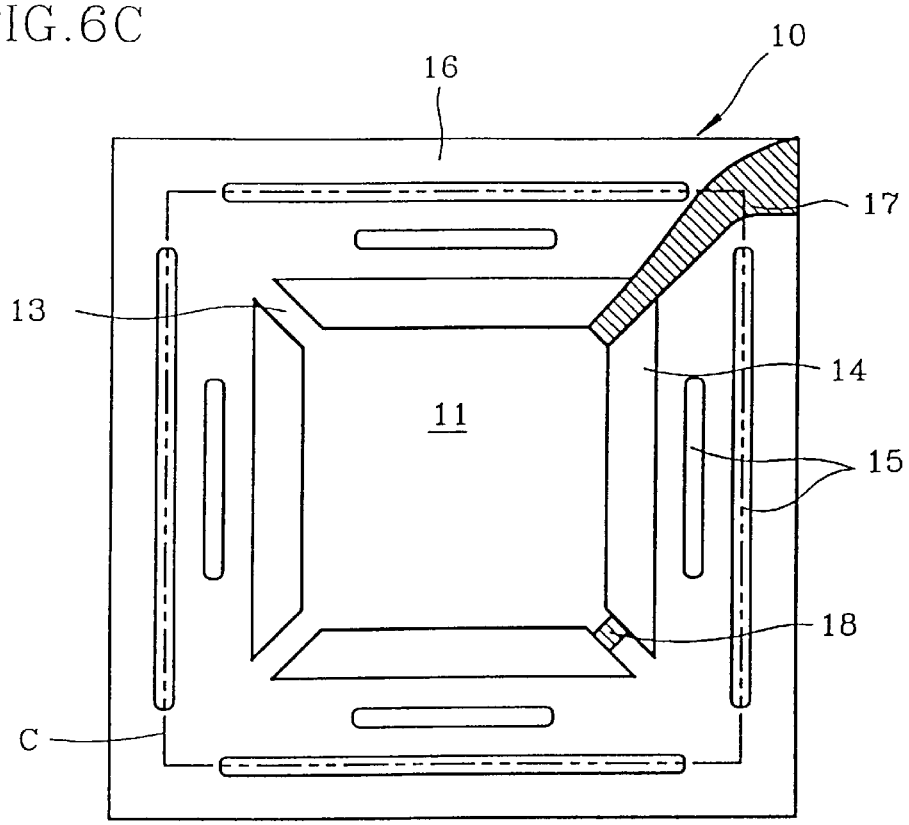
FIG. 6C and 6D are plan views respectively illustrating carrier frames used in the tenth and eleventh embodiments of the present invention.
Figure 6D:
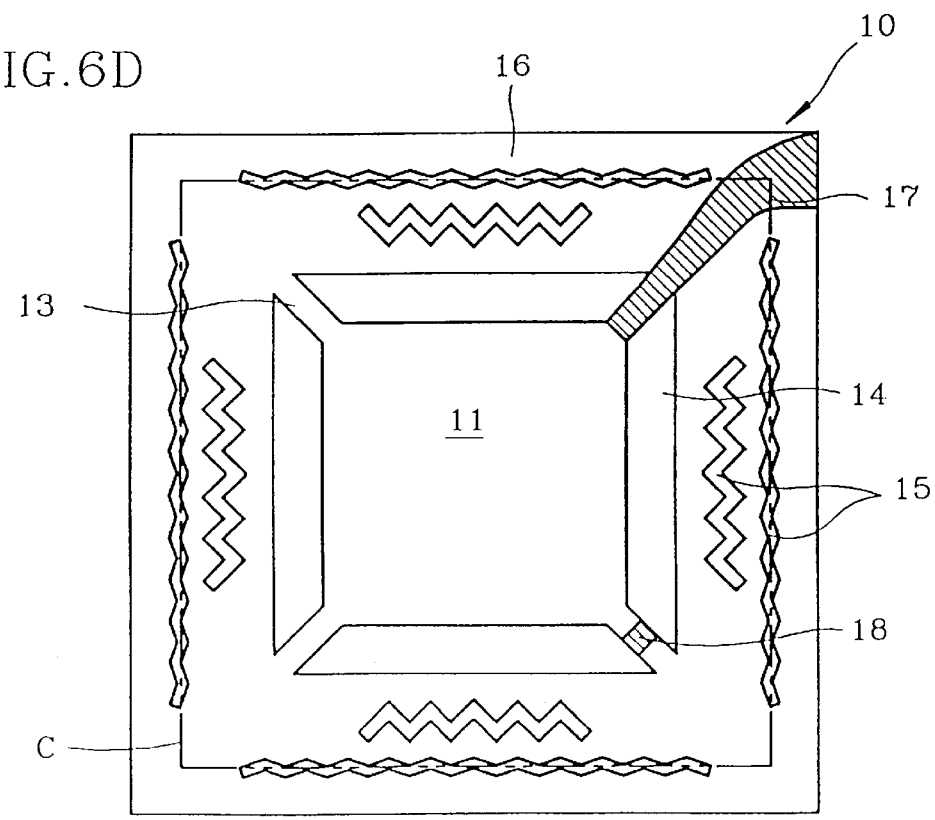

FIGS. 6A to 6D are sectional views and plan views respectively illustrating BGA semiconductor packages respectively using carrier frames 10 configured to improve the bonding force between the encapsulate 40 and other constituting elements of the BGA semiconductor packages in accordance with tenth and eleventh embodiments of the present invention. These embodiments are similar to the eighth and ninth embodiments. As shown in FIGS. 6C and 6D, the carrier frame 10 of the tenth or eleventh embodiment, which includes a heat discharge plate 11 as well as an outer support plate 16, has a plurality of slots 15 formed in the outer support plate 16. By virtue of such a configuration, the bonding area between the encapsulate 40 and outer support plate 16 increases as shown in FIG. 6A or 6B. In particular, in the case of the eleventh embodiment, the slots 15 have a wave shape. That is, the slots 15, may have various shapes such as a slot shape or a wave shape.

Figure 7:
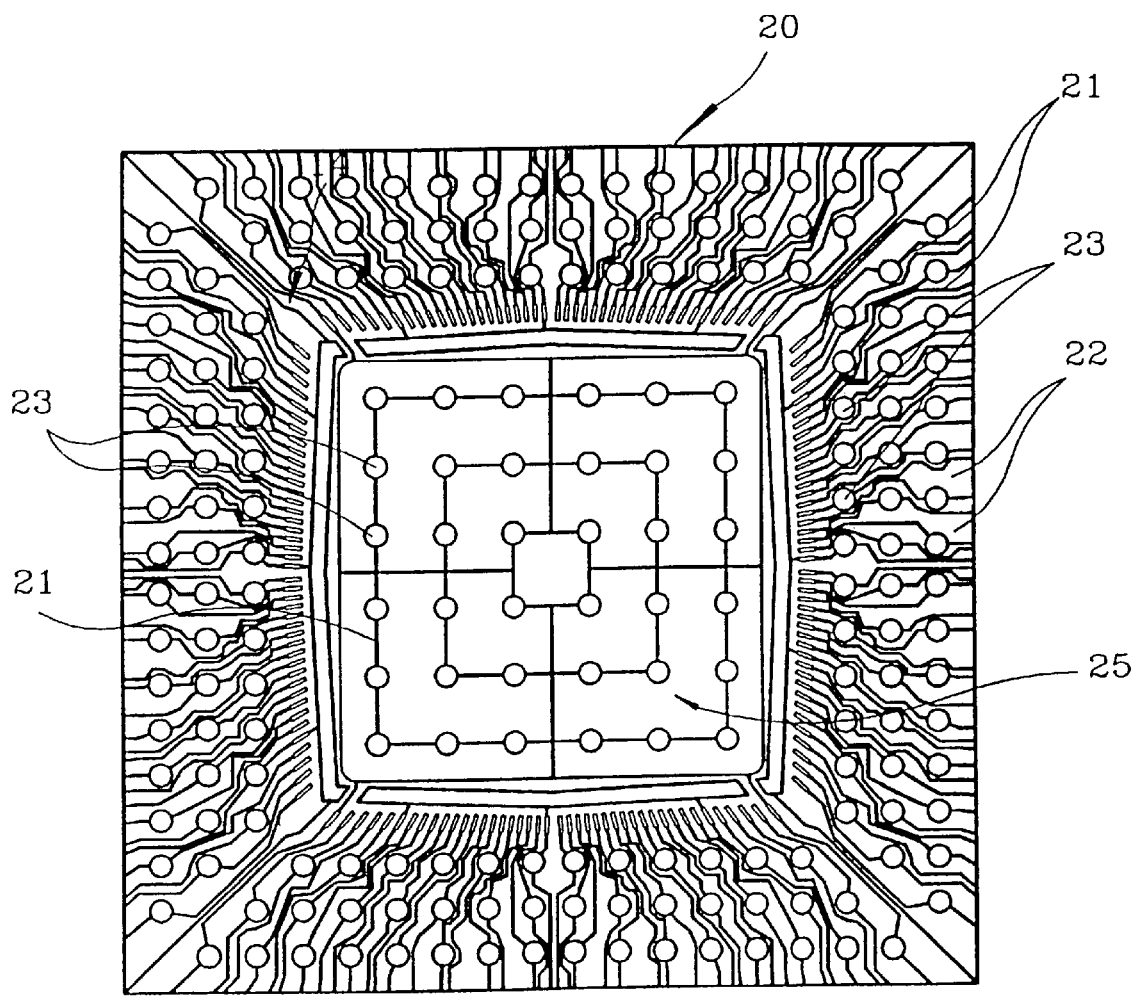
FIG. 7 is a plan view illustrating the flexible circuit plate used in all the embodiments of the present invention.

On the other hand, FIG. 7 illustrates a flexible circuit board which is used as a constituting element in all the above-mentioned embodiments of the present invention. As shown in FIG. 7, the flexible circuit board, which is denoted by the reference numeral 20, includes a circuit pattern 21 formed only on the upper surface of a flexible resin film 22. A plurality of solder ball lands 23 are formed on the lower surface of the flexible resin film 22 in such a manner that they are downwardly exposed. The solder ball lands 23 are connected to the circuit pattern 21. The formation of the flexible circuit board 20 is achieved by forming a copper thin film over the flexible resin film 22, which is made of a polymer resin, patterning the copper thin film, thereby forming the circuit pattern 21, and then forming a plurality of solder ball lands 23 on the flexible resin film 22 in such a manner that they are connected to the circuit pattern 21 while being downwardly exposed.

Figure 8:
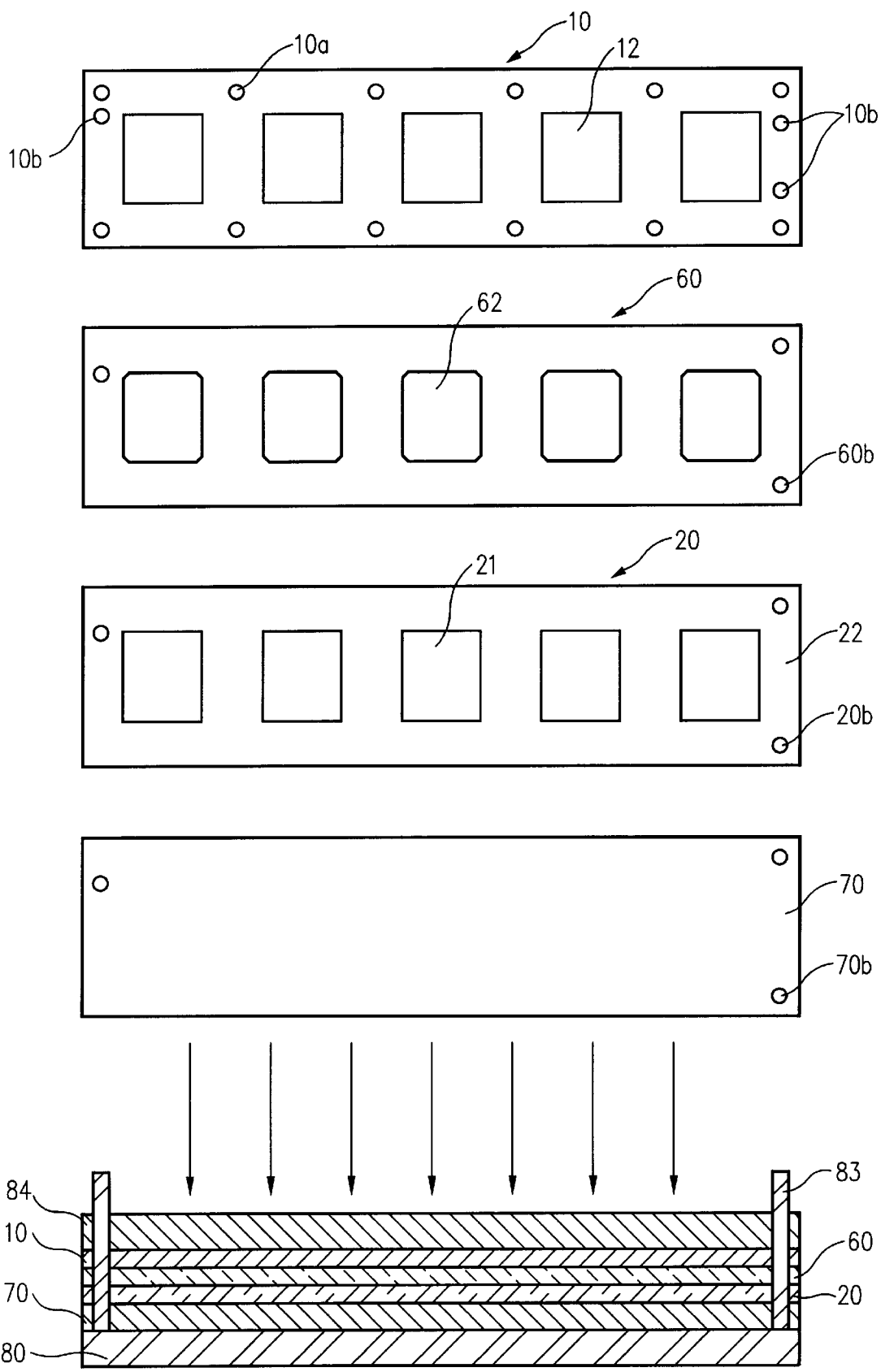
FIG. 8 is a view illustrating the procedure of bonding a carrier frame to a flexible circuit board in the fabrication of a BGA semiconductor package using the flexible circuit board.

FIG. 8 illustrates the procedure of bonding the carrier frame 10 to the flexible circuit board 20 in the fabrication of the BGA semiconductor package 50 using the flexible circuit board. As shown in FIG. 8, the flexible circuit board 20, adhesive means 60 and carrier frame 10 are laid, in this order, on a lower flat plate 70 laid on a jig 80 such that they are interposed between the lower flat plate and an upper flat plate 84. These elements are aligned together as they are coupled to pins 83 upwardly protruded from the jig 80. Under this condition, pressure is applied to the upper flat plate 84 to bond the carrier frame 10 to the flexible circuit board 20.

Figure 9A:
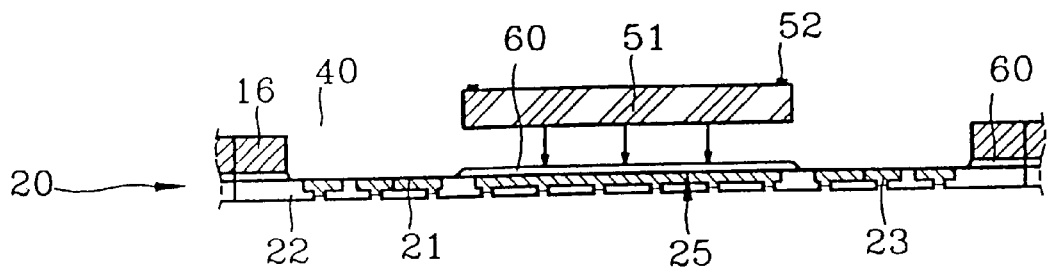
FIGS. 9A to 9G are sectional views respectively illustrating sequential steps of a method for fabricating a BGA semiconductor package using the flexible circuit board, to which the carrier frame is bonded as shown in FIG. 8, in accordance with the present invention.
Figure 9B:
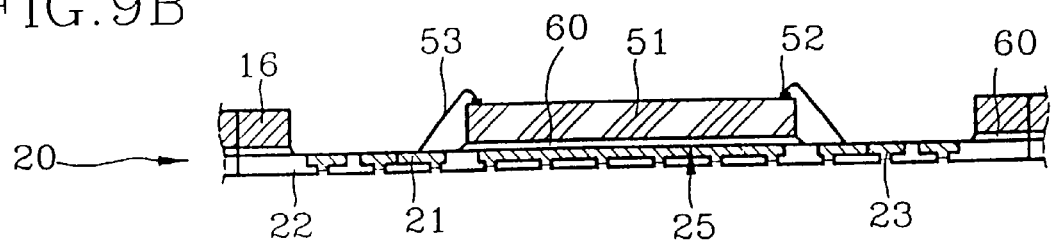
Figure 9C:
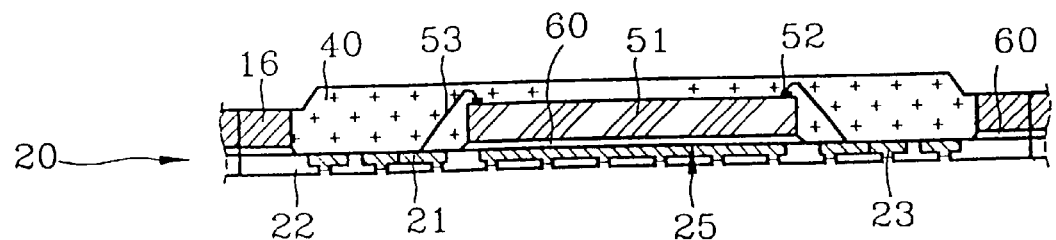
Figure 9D:
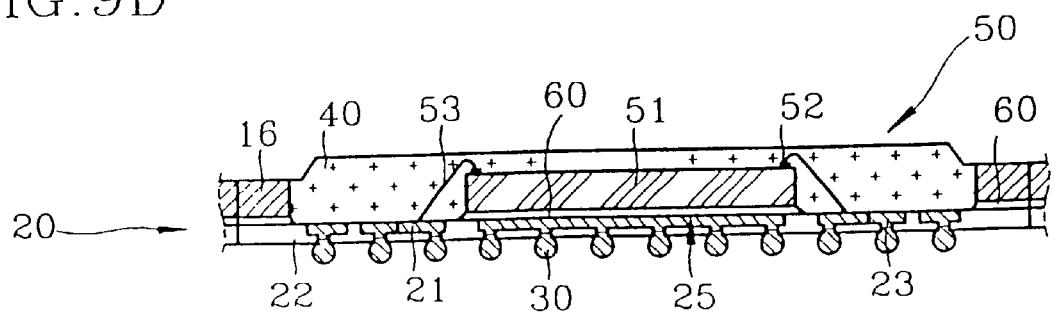
Figure 9E:
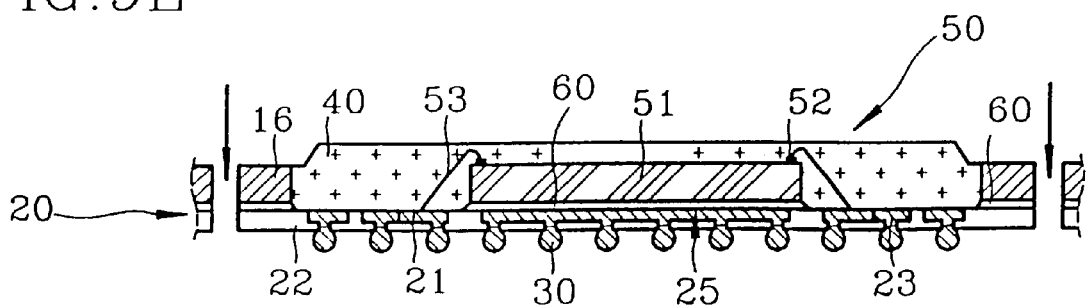

FIGS. 9A to 9G are sectional views respectively illustrating sequential steps of a method for fabricating a BGA semiconductor package using the flexible circuit board, to which the carrier frame is bonded as mentioned above, in accordance with the present invention. The procedure of bonding the carrier frame to the flexible circuit board and the procedure of fabricating the BGA semiconductor package are carried out in a continuous manner. The method of the present invention involves a semiconductor chip bonding step (FIG. 9A), a wire bonding step (FIG. 9B), an encapsulating step (FIG. 9C), a solder ball fusing step (FIG. 9D), and a cutting step (FIG. 9E).

Now, the BGA semiconductor packages respectively using the above-mentioned flexible circuit boards according to the present invention and methods for fabricating those BGA semiconductor packages will be described in more detail in conjunction with the annexed drawings.

First, the basic configuration of the flexible circuit boards 20 will be described in conjunction with FIG. 7. The flexible circuit board 20 shown in FIG. 7 has a flexible resin film 22 and a circuit pattern 21 comprised of a single copper thin film formed on the flexible resin film 22. A plurality of solder ball lands 23 are formed on the lower surface of the flexible resin film 22 in such a manner that they are connected to the circuit pattern 21 while being outwardly exposed.

The circuit pattern 21 is further comprised of a nickel (Ni) layer (not shown) and a gold (Au) layer (not shown) sequentially plated on the copper thin film. The flexible circuit board 20 is centrally defined with a region where a die paddle 25 is formed. A semiconductor chip, which will be described hereinafter, is directly bonded on the die paddle 25. Alternatively, the heat discharge plate of a carrier frame is bonded to the die paddle 25 by an adhesive means. The flexible resin film 22 has a thickness ranging from 20 microns to 150 microns. Where the flexible resin film 22 has a thickness of less than 20 microns, it may be broken in the process of the package fabrication. Where the flexible resin film 22 has a thickness of more than 150 microns, an increase in thermal resistivity occurs. Furthermore, it is impossible to obtain a light and thin package structure. In accordance with the present invention, it is unnecessary to form a solder mask on the flexible circuit board 20, as compared to the conventional configuration. In particular, it is unnecessary to form conductive via holes because the flexible circuit board 20 has a circuit pattern 21 at only one surface thereof. By virtue of such a configuration, a thin and light package structure is obtained. The entire length of the circuit pattern 21 is also reduced. As a result, an improvement in electrical performance is obtained.

FIG. 3D shows a typical configuration of the carrier frame 10 adapted to easily discharge heat from the semiconductor chip and to reduce the inductance and capacitance of the circuit pattern while absorbing the coupling effect of the circuit pattern, thereby improving the heat discharge performance and electrical performance. As shown in FIG. 3D, the carrier frame 10 has, at the central portion thereof, a square heat discharge plate 11 on which the semiconductor chip is mounted by an adhesive means. Tie bars 13 are formed at four corners of the heat discharge plate 11. The carrier frame 10 also has an outer support plate 16 shaped into a square rim and arranged around the heat discharge plate 11 in such a manner that it is connected with the outer ends of the tie bars 13. A plurality of openings 14 having a trapezoidal shape are formed between the heat discharge plate 11 and outer support plate 16. The openings 14 may have various shapes. For example, the 14 may have a slot shape, as shown in FIG. 4B (seventh embodiment).

The heat discharge plate 11 may be removed to improve the bonding force between the carrier frame 10 and other constituting elements of the BGA semiconductor packages, thereby removing a bending phenomenon of the package, as shown in FIG. 5C and 5D (eight and ninth embodiments). In this case, a central opening 12 is provided at the carrier frame 10. The outer support plate 16 may have a plurality of slots 15 which have a slot shape or a wave shape. Alternatively, the heat discharge plate 11 may be left under the condition in which the size of the openings 14 is reduced, as shown in FIGS. 6C and 6D (tenth and eleventh embodiments). In this case, the size of the slots 15 formed at the outer support plate 16 increases. As mentioned above, the first and slots 14 and 15 may have various shapes. In the drawings, the reference character C denotes a cutting line along which the carrier frame is cut by a cutting means in the process of the package fabrication.

The carrier frame 10 is subjected to a surface treatment, for example, an oxidization (not shown) using an etchant solution, at its surface portion which will be subsequently encapsulated by an encapsulate, in order to maximize the bonding force to the encapsulate. Ground bonding regions 18 are formed on the tie bars 13 of the carrier frame 10 using silver (Ag) and palladium (Pd) so as to achieve a good ground bonding between the tie bars 13 and the input/output pads of the semiconductor chip which will be subsequently carried out. Silver and palladium are plated on a selected one of the tie bars 13 and a portion of the outer support plate 16 straightly extending from the selected tie bar 13, thereby forming a molding gate 17. By such a configuration, the encapsulation, which will be subsequently carried out, can be easily achieved. The outer support plate 16 or heat discharge plate 11 may also have ground bonding regions 18, as in the tie bars 13. The shape and size of the ground bonding regions 18 are optional.

The carrier frame 10 may be made of any material in so far as the material exhibits superior thermal conductivity. Preferably, copper (Cu), copper alloy, aluminum (Al) or stainless steel may be used. The carrier frame 10, which have constituting elements such as the heat discharge plate 11, tie bars 13 and outer support plate 16, may be fabricated using a chemical etching method or a stamping method. In the stamping method, a press is used.

Various embodiments of BGA semiconductor packages fabricated using the above-mentioned flexible circuit 20 and carrier frame 10 will now be described in detail in conjunction with the drawings.

Referring to FIG. 2A which is associated with the first embodiment of the present invention, a semiconductor chip 51 is shown which has a plurality of input/output pads 52 at the upper surface thereof. A flexible circuit board 20, which comprises a flexible resin film 22 and a circuit pattern 21 formed on the flexible resin film 22, is bonded to the lower surface of the semiconductor chip 51 by an adhesive means 60. The circuit pattern 21 of the flexible circuit board 20 is bonded to the input/output pads 52 of the semiconductor chip 51 by conductive wires 53, respectively. The semiconductor chip 51 and conductive wires 53 are encapsulated by an encapsulate 40 in order to protect them from various outside contaminant or mechanical impact. A plurality of solder balls 30 are fused as input/output terminals on the lower surface of the flexible circuit board 20. An outer support plate 16, which is included in the carrier frame 10 provided for the support and easy handling of constituting elements of a package, is bonded to the outer edge portion of the upper surface of the flexible circuit board 20 by the adhesive means 60 while being in contact with the outer edge of an encapsulate 40.

Preferably, the adhesive means 60 comprises an epoxy when it is used to bond the semiconductor chip 51. For the bonding of the carrier frame 10, the adhesive means comprises a polyimide tape. However, other adhesive means may be used.

The electrical connection between the flexible circuit board 20 and the semiconductor chip 51 laid on the flexible circuit board 20 is achieved by wire-bonding ends of the circuit pattern 21 formed on the flexible circuit board 20 to the input/output pads 52 formed on the semiconductor chip 51 using conductive wires 53, respectively. Preferably, the conductive wires 53 are comprised of gold wires or aluminum wires.

Since the semiconductor chip 51, the conductive wires 53 and the circuit pattern 21 of flexible circuit board 20 are sensitive to outside moisture, dust, and various mechanical impact or vibrations, they are encapsulated by the encapsulate 40 so that they are protected. Preferably, the encapsulate 40 comprises a liquid epoxy or an epoxy molding compound. Where the epoxy molding compound is used as the encapsulate 40, the molding gate 17, which is described in conjunction with the carrier frame 10, is provided to obtain an advantage in the package fabrication.

The fusing of the solder balls 30 on the lower surface of the flexible circuit board 20 is carried out in an inverted state of the package. Under this condition, solder balls 30, which are made of an alloy of tin (Sn) and lead (Pb), are fused on solder ball lands 23 defined on the lower surface of the flexible circuit board 20 in a high temperature environment. The solder balls 30 are used as input/output means to a main board.

The outer support plate 16 of the carrier frame 10 serves to maintain the flexible circuit board 20 in a rigid state so as to obtain an easy handling of the flexible circuit board 20 in the package fabrication. The outer support plate 16 serves to improve the heat discharge performance. The carrier frame 10, which is used in the first embodiment of the present invention, is free of the heat discharge plate 11 and tie bars 13, so that an opening 12 is defined at the central portion of the carrier frame 10. That is, this carrier frame 10 has only the outer support plate 16.

Referring to FIG. 2B which is associated with the second embodiment of the present invention, the outer support plate 16 of the carrier frame 10 is cut by a cutting means (not shown) so that an encapsulate 40 is formed on a region inwardly spaced from the outer edge of the flexible circuit board 20 by a desired distance. This package structure is obtained by removing the outer support plate 16 of the carrier frame 10 from the finally obtained package after using it in the process of the package fabrication. In this case, there is an advantage in that the carrier frame can be repeatedly used. The selection of such a package structure is optional. That is, where the user does not want to use the outer support plate 16, this outer support plate 16 is cut from the carrier frame 10 using a cutting means.

On the other hand, in addition to the outer support plate 16, the portion of the flexible circuit substrate 20, to which the outer support plate 16 is bonded, may be removed using the cutting means in the process of the package fabrication, as in the third embodiment of the present invention shown in FIG. 2C. In the case of the first, second and third embodiments of the present invention, the use of conductive via holes and solder masks is eliminated. The elimination of such elements is an objective of the present invention. In these embodiments, a flexible circuit board is used which has a thickness of 20 to 150 microns and is formed at only one surface thereof with a circuit pattern having a small length. Accordingly, a thin and light package structure is obtained in accordance with those embodiments.

A carrier frame 10, which comprises a heat discharge plate 11, tie bars 13 and an outer support plate 16, may be used, as in the fourth embodiment of the present invention shown in FIG. 3A. In this case, the carrier frame 10 is bonded between the flexible circuit board 20 and semiconductor chip 51 by an adhesive means 60. The carrier frame 10 may have a configuration in which the outer support plate 16 is removed using a cutting means, as in the fifth embodiment of the present invention shown in FIG. 3B. The carrier frame 10 may also have a configuration in which the portion of the flexible circuit substrate 20, to which the outer support plate 16 is bonded, is removed using the cutting means, in addition to the outer support plate 16, as in the sixth embodiment of the present invention shown in FIG. 3C. The fourth, fifth and sixth embodiments are adapted to achieve an easy handling of the flexible circuit board 20 in the process of the package fabrication by the outer support plate 16 of the carrier frame 10 disposed on the outer edge portion of the flexible circuit board 20. In accordance with these embodiments, the heat discharge plate 11 of the carrier frame 10 is disposed beneath the semiconductor chip 51, so that heat from the semiconductor chip 51 is easily outwardly discharged. Accordingly, an improvement in the electrical performance and heat discharge performance is achieved.

In order to further improve the heat discharge performance, openings 14 having a slot shape may be formed in a region only where the circuit pattern 21 on the flexible circuit board 20 is wire-bonded to input/output pads 52 of the semiconductor chip 51, as in the seventh embodiment of the present invention shown in FIGS. 4A and 4B. In this configuration, the area of the carrier frame 10 increases.

A plurality of slots 15 may also be formed at a portion of the carrier frame 10 inside the outer support plate 16 to improve the bonding force to the encapsulate 40, as in the eighth, ninth, tenth and eleventh embodiments of the present invention shown in FIGS. 5A to 6D. By virtue of the formation of the slots 15, the bonding area to the encapsulate 40 increases, thereby obtaining an improvement in the bonding force. Accordingly, it is possible to prevent a bending phenomenon of the BGA semiconductor package mounted on the main board due to heat generated during the operation of the package. That is, these embodiments are adapted to eliminate a bending phenomenon of the package by additionally forming a plurality of slots 15 in the carrier frame 10, thereby improving the bonding force between the encapsulate 40 and other constituting elements of the package.

The use and shape of the metallic carrier frame 10 is optional. A carrier frame, which has various shapes, may be used under the condition in which it is bonded to the flexible circuit board 20 by the adhesive means 60. After the completion of the package fabrication, a desired portion of the used carrier frame may be cut out, if necessary.

Meanwhile, the semiconductor chip 51 may be directly bonded to the upper surface of the die paddle 25 formed at the central portion of the flexible circuit board 20 by the adhesive means 60, as shown in FIGS. 2A to 2C and FIGS. 5A and 5B. Alternatively, the semiconductor chip 51 may be bonded to the upper surface of the die paddle 25 of the flexible circuit board 20 by the adhesive means 60 in such a manner that the heat discharge plate 11 of the carrier frame 10 is interposed between the die paddle 25 and semiconductor chip 51, as shown in FIGS. 3A to 3C, FIG. 4A and FIGS. 6A and 6B. In this case, a polyimide tape or epoxy exhibiting a high thermal conductivity is used as the adhesive means 60 so that heat from the semiconductor chip 51 is well transferred to the heat discharge plate 11 of the carrier frame 10.

FIG. 8 illustrates the procedure of bonding the carrier frame 10 to the flexible circuit board 20. In FIG. 8, the element shown in the uppermost portion of the drawing is the carrier frame, the element shown in the second upper portion of the drawing is the adhesive means 60, and the third upper portion of the drawing is the flexible circuit board 20. In FIG. 8, the reference numerals 70 and 84 denote a lower flat plate and an upper flat plate, respectively.

As mentioned above, the flexible circuit board 20 comprises circuit patterns 21 which are formed on the flexible resin film 22 using a well-known pattern forming method. The flexible circuit board 20 also comprises pin holes 20b. As shown in FIG. 8, the flexible circuit board 20 may have a strip shape or a reel shape. The flexible circuit board 20 may also have the form of individual units.

The adhesive means 60 includes pin holes 60b and openings 62 which correspond to the pin holes 20b and circuit patterns 21 of the flexible circuit board 20, respectively.

As in the adhesive means 60, the carrier frame 10 includes pin holes lob and openings 12 which correspond to the pin holes 20b and circuit patterns 21 of the flexible circuit board 20, respectively. The carrier frame 10 also includes guide holes 10a adapted to achieve an easy feeding and positioning of the carrier frame.

The upper and lower flat plates 84 and 70 only have pin holes 70b. The element shown in the lowermost portion of FIG. 8 is the jig 80. The lower flat plate 70, flexible circuit board 20, adhesive means 60, carrier frame 10 and upper flat plate 84 are laid, in this order, on the jig 80 in such a manner that pins 83 upwardly protruded from the jig 80 pass through associated pin holes of the elements laid on the jig 80. Thereafter, the elements laid on the jig 80 are clamped. Under this condition, pressure is applied to the upper flat plate 84 to bond the carrier frame 10 to the flexible circuit board 20 by the adhesive means 60. Since the circuit pattern 21 is shielded from the outside by the adhesive means 60, it is unnecessary to additionally form a solder mask as in the conventional case.

FIGS. 9A to 9G are sectional views respectively illustrating sequential steps of a method for fabricating a BGA semiconductor package using the flexible circuit board 20, to which the carrier frame 10 is bonded as mentioned above, in accordance with the present invention. For the simplicity of the description, this method will now be described in conjunction with the case in which a flexible circuit board associated with one of the first, second and third embodiments of the present invention is used.

In accordance with the method of the present invention, the carrier frame 10, which comprises a heat discharge plate 11 and an outer support plate 16, is first bonded to the flexible circuit board 20 having a circuit pattern 21 formed on its flexible resin film 22, by an adhesive means 60. Thereafter, a semiconductor chip 51 is bonded to the heat discharge plate 11 using an adhesive means 60 (FIG. 9A).

Subsequently, the circuit pattern 21 of the flexible circuit board 20 is wire-bonded to the semiconductor chip 51 by conductive wires 53 such as gold wires or aluminum wires (FIG. 9B).

The semiconductor chip 51 and conductive wires 53 are then encapsulated by an encapsulate 40 such as an epoxy molding compound or glob top in order to protect them from the environment (FIG. 9C).

Solder balls 30, which are made of an alloy of tin and lead, are then fused on the lower surface of the flexible circuit board 20 in a furnace to provide input/output terminals (FIG. 9D). Thus, a BGA semiconductor package 50 is obtained.

Figure 9F:
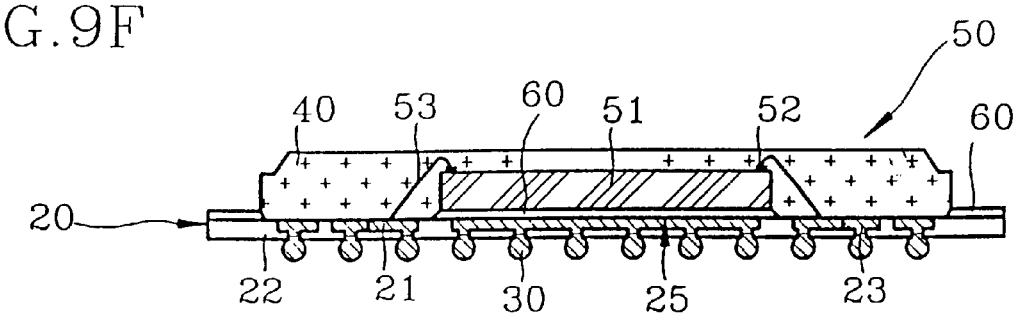
Figure 9G:
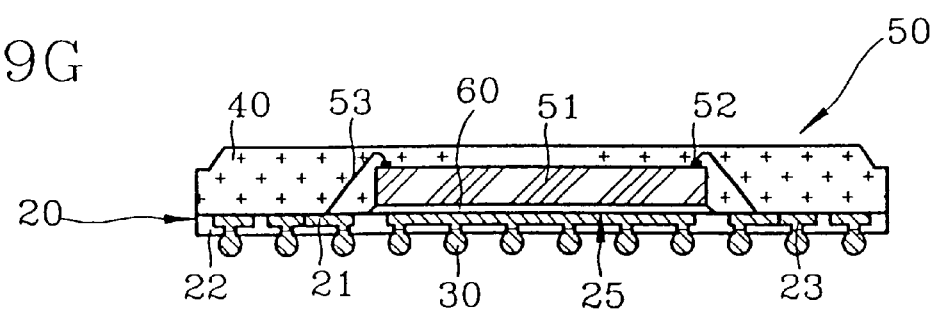

Practically, the carrier frame 10 and flexible circuit board 20 have a strip shape to fabricate a plurality of packages in a simultaneous manner. Accordingly, the fabricated packages are cut into individual ones using a cutting means. The cutting of the packages may be carried out in such a manner that the outer support plate 16 of the carrier frame 20 in each package is left while being bonded to the outer edge portion of the upper surface of the flexible circuit board 20, as shown in FIG. 9E. Alternatively, the cutting of the packages may be carried out in such a manner that the outer support plate 16 of the carrier frame 20 in each package is removed while the outer edge portion of the flexible circuit board 20 protrudes outwardly beyond the outer edge of the encapsulate 40, as shown in FIG. 9F. The cutting of the packages may also be carried out in such a manner that in addition to the outer support plate 16, the portion of the flexible circuit substrate 20, to which the outer support plate 16 is bonded, is removed.

Although the package fabrication method of the present invention has been described in conjunction with the carrier frame which comprises only the outer support plate 16, it can also be applied to the case in which the carrier frame further comprises the heat discharge plate 11 and tie bars 13. In the latter case, the method requires only a slight modification thereof which is easily appreciable by those skilled in the art. This method is also used in the case in which the carrier frame further comprises a plurality of slots 15 formed in the outer support plate 16 thereof. In this case, it is only additionally required to cut portions of the outer support plate 16, where the slots 15 are formed, in such a manner that the outer support plate 16 is partially disposed within the encapsulate 40.

As apparent from the above description, the BGA semiconductor package fabricated using the flexible circuit board according to the present invention mainly provides the following three effects.

First, the package has a thin and light structure because it is fabricated using the flexible circuit board which has no conductive via holes nor solder mask while having a thin structure formed at only one surface thereof with a circuit pattern having a small length.

Second, an easy handling of the flexible circuit board is achieved because a metallic carrier frame is mounted on the flexible circuit board. It is also possible to achieve a reduction in the inductance, impedance and coupling effect of adjacent circuit patterns, thereby achieving an improvement in electrical performance. In addition, heat from a semiconductor chip is easily outwardly discharged, thereby achieving an improvement in the electrical performance and heat discharge performance.

Third, the bonding force between the encapsulate and constituting elements of the package increases because the carrier frame has a plurality of openings. Accordingly, it is possible to eliminate a bending phenomenon of the package.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method of fabricating a ball grid array semiconductor package comprising:

forming a flexible circuit board from a thin, flexible film, the circuit board having an upper surface, a lower surface, a circuit pattern formed on the upper surface, a plurality of solder ball lands disposed on the lower surface, and a plurality of apertures extending through the film between the circuit pattern and the solder ball lands;

forming a carrier frame comprising an outer support plate having a window therein;

bonding the carrier frame to the upper surface of the flexible circuit board such that the circuit pattern is framed within the window of the outer support plate, and such that the outer support plate supports and stiffens the flexible circuit board;

bonding a semiconductor chip to the flexible circuit board inside the window of the outer support plate using adhesive means;

wire-bonding the semiconductor chip to the circuit pattern of the flexible circuit board by conductive wires;

encapsulating the semiconductor chip and the conductive wires with an encapsulant to protect them from the environment; and fusing a plurality of solder balls to the solder ball lands on the lower surface of the flexible circuit board such that the solder balls connect through the apertures to the circuit pattern on the upper surface thereof and function as input/output means for the package.

2. The method of claim 1, further comprising cutting the outer support plate of the carrier frame away from the package so that a portion of the flexible circuit board disposed beneath the outer support plate remains extending beyond the edges of the encapsulant.

3. The method of claim 1, further comprising cutting the outer support plate of the carrier frame and a portion of the flexible circuit board disposed beneath the outer support plate away from the package.

4. The method of claim 1, wherein the flexible circuit board is formed from a film of polyimide resin.

5. The method of claim 1, wherein the flexible circuit board is formed to have a thickness of from about 20 microns to about 150 microns.

6. The method of claim 1, wherein the circuit pattern on the flexible circuit board is formed of a layer of at least one of copper, nickel and gold.

7. The method of claim 1, wherein the carrier frame comprises a metal.

8. The method of claim 7, wherein the carrier frame is formed from at least one of copper, a copper alloy, aluminum and stainless steel.

9. The method of claim 1, wherein:

forming the carrier plate further comprises forming a heat discharge plate within the window of the outer support plate;

bonding the carrier frame to the upper surface of the flexible circuit board further comprises bonding a lower surface of the heat discharge plate to the upper surface of the circuit board; and, bonding the semiconductor chip to the flexible circuit board further comprises bonding the semiconductor chip to an upper surface of the heat discharge plate.

10. The method of claim 9, further comprising forming a tie bar connecting the heat discharge plate to the outer support plate.

11. The method of claim 1, further comprising plating at least one of silver and palladium onto portions of the carrier frame for ground-bonding of conductive wires thereto.

12. The method of claim 9, further comprising plating at least one of silver and palladium onto portions of the heat discharge plate for ground-bonding of conductive wires thereto.

13. The method of claim 10, further comprising plating at least one of gold and silver onto the tie bar and a portion of the outer support plate adjacent to the tie bar to form a molding gate thereon.

14. The method of claim 1, wherein:

forming the carrier plate further comprises forming an opening in a portion of the outer support plate between the central window and an outside edge of the plate; and, encapsulating the semiconductor chip and the conductive wires further comprises encapsulating the portion of the outer support plate containing the opening such that the bond area between the encapsulant, the support plate, and the circuit board is increased, thereby increasing the strength of the bond.

15. The method of claim 14, wherein the opening is formed in the shape of a slot or a wave.

16. The method of claim 9, further comprising forming an opening in the outer support plate adjacent to the heat discharge plate to enable a wire bond to be made between the semiconductor chip and the circuit board.

17. The method of claim 1, further comprising treating the surface of the carrier frame to increase the strength of its bond with the encapsulant.

18. The method of claim 1, wherein the carrier plate is formed by etching or die stamping.

19. The method of claim 1, wherein at least one of the carrier frame and the semiconductor chip are bonded to the flexible circuit board by means of a polyimide tape or an epoxy.

20. The method of claim 3, wherein a plurality of ball grid array semiconductor packages are simultaneously fabricated in the form of a strip of connected packages, and wherein cutting the outer support plate of the carrier frame away from the completed package further comprises simultaneously cutting the strip of connected packages into individual units.

* * * * *

UNITED STATES PATENT AND TRADEMARK OFFICE
CERTIFICATE OF CORRECTION

PATENT NO.    : 5,953,589
ISSUE DATE    : September 14, 1999
INVENTOR(S)   : Shim, Il Kwon; Heo, Young Wook; Darveaux, Robert F.

It is certified that error appears in the above-identified patent and that said Letters Patent is hereby corrected as shown below:

On the title page item [75], Inventors, change the last, or surname, of the third-listed inventor from "Darreaux" to --Darveaux--.

Signed and Sealed this

Twenty-fifth Day of April, 2000

Attest:

Q. TODD DICKINSON

*Attesting Officer*                    *Director of Patents and Trademarks*